(12) United States Patent
Shabtay et al.

(10) Patent No.: US 8,159,602 B2
(45) Date of Patent: Apr. 17, 2012

(54) IMAGING SYSTEM WITH RELAXED ASSEMBLY TOLERANCES AND ASSOCIATED METHODS

(75) Inventors: Gal Shabtay, Tel-Aviv (IL); Efraim Goldenberg, Tel-Aviv (IL)

(73) Assignee: DigitalOptics Corporation Europe Limited, Ballybrit, Galway (IE)

( * ) Notice: Subject to any disclaimer, the term of this patent is extended or adjusted under 35 U.S.C. 154(b) by 917 days.

(21) Appl. No.: 12/213,473

(22) Filed: Jun. 19, 2008

(65) Prior Publication Data

US 2009/0122180 A1    May 14, 2009

(51) Int. Cl.
*H04N 5/222* (2006.01)
*H04N 5/225* (2006.01)
(52) U.S. Cl. ......... 348/373; 348/340; 257/432; 257/433
(58) Field of Classification Search ............... 348/231.2, 348/231.3, 231.7, 340
See application file for complete search history.

(56) References Cited

U.S. PATENT DOCUMENTS

| | | | |
|---|---|---|---|
| 5,734,155 A | 3/1998 | Rostoker | |
| 5,783,815 A | 7/1998 | Ikeda | |
| 5,821,532 A | 10/1998 | Beaman et al. | |
| 6,900,509 B2 | 5/2005 | Gallup et al. | |
| 6,911,638 B2 | 6/2005 | Dowski, Jr. et al. | |
| 6,993,204 B1 | 1/2006 | Yahil et al. | |
| 7,061,693 B2 | 6/2006 | Zalevsky | |
| 7,180,673 B2 | 2/2007 | Dowski, Jr. | |
| 7,298,497 B2 | 11/2007 | Millerd et al. | |
| 7,679,830 B2 | 3/2010 | Dowski, Jr. | |
| 7,697,061 B2 * | 4/2010 | Chang | 348/369 |
| 7,876,440 B2 | 1/2011 | Meiher et al. | |
| 7,969,669 B1 * | 6/2011 | Wu | 359/823 |
| 2002/0154239 A1 | 10/2002 | Fujimoto et al. | |
| 2004/0150740 A1 * | 8/2004 | Hsin | 348/340 |
| 2004/0190762 A1 | 9/2004 | Dowski et al. | |
| 2004/0212719 A1 * | 10/2004 | Ikeda | 348/340 |
| 2004/0228005 A1 | 11/2004 | Dowski, Jr. | |
| 2004/0256687 A1 | 12/2004 | Omori | |
| 2005/0264886 A1 | 12/2005 | Dowski, Jr. | |
| 2006/0043512 A1 | 3/2006 | Oliver et al. | |
| 2006/0048090 A1 | 3/2006 | Feldman | |
| 2006/0091487 A1 | 5/2006 | Hanada et al. | |
| 2008/0049226 A1 | 2/2008 | Meiher et al. | |
| 2008/0252769 A1 * | 10/2008 | Verstegen et al. | 348/335 |
| 2010/0039689 A1 * | 2/2010 | Sayag | 359/241 |

FOREIGN PATENT DOCUMENTS

| | | |
|---|---|---|
| EP | 0 585 186 A2 | 3/1994 |
| EP | 1 607 782 A2 | 12/2005 |
| WO | WO 92/15036 A1 | 9/1992 |
| WO | WO 99/57599 A1 | 11/1999 |

(Continued)

OTHER PUBLICATIONS

Levy, Uriel, et al., "Engineering space-variant inhomogeneous media for polarization control", Optics Letters, vol. 29, No. 15, pp. 1718-1720 (Aug. 1, 2004).

(Continued)

*Primary Examiner* — Hung Lam
(74) *Attorney, Agent, or Firm* — Lee & Morse, P.C.

(57) ABSTRACT

An imaging system includes an extended depth of field (EDOF) optical system, a sensor on a sensor substrate, and a securing mechanism adapted to secure the EDOF optical system directly to the sensor substrate.

22 Claims, 7 Drawing Sheets

FOREIGN PATENT DOCUMENTS

| WO | WO 03/076984 A1 | 9/2003 |
|----|-----------------|--------|
| WO | WO 2004/090581 A2 | 10/2004 |
| WO | WO 2005/114750 A1 | 12/2005 |
| WO | WO 2006/072581 A1 | 7/2006 |

OTHER PUBLICATIONS

Bradburn, et al.; Realizations of focus invariance in optical-digital systems with wave-front coding; Applied Optics; Dec. 10, 1997; pp. 9157-9166; vol. 36, No. 35; Optical Society of America; United States.

European Office Action in EP 07870432.7-2202, dated Aug. 3, 2011 (Shabtay, et al.)

European Search Report in EP 07872051.3-2202, dated Jan. 21, 2010 (Shabtay, et al.).

European Office Action in EP 07872051.3-2202, dated Aug. 3, 2011 (Shabtay, et al.).

* cited by examiner

IMAGING SYSTEM WITH RELAXED ASSEMBLY TOLERANCES AND ASSOCIATED METHODS

CROSS REFERENCE TO RELATED APPLICATIONS

This is a Continuation application based on PCT International Application PCT/IB2007/004380, filed Sep. 14, 2007, which in turn claims priority to U.S. Provisional Application Ser. No. 60/825,621, filed Sep. 14, 2006, the entire contents of which are hereby incorporated by reference.

BACKGROUND OF THE INVENTION

1. Field of the Invention

Embodiments are directed to an imaging system, more particularly to an imaging system having relaxed assembly tolerances, and associated methods.

2. Description of Related Art

Image capturing devices have become widely used in portable and non-portable devices such as cameras, mobile phones, webcams and notebooks. These image capturing devices conventionally include an electronic image detector such as a CCD or CMOS sensor, a lens system for projecting an object in a field of view (FOV) onto the detector and electronic circuitry for receiving and storing electronic data provided by the detector.

Figure 10:
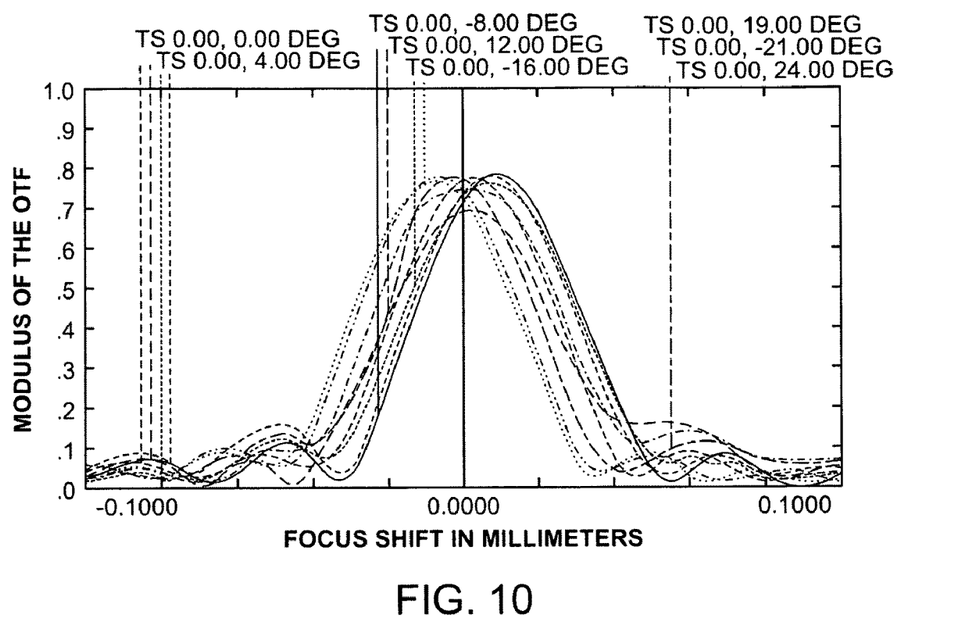
FIG. 10 illustrates a TF-MTF versus focus shift for a conventional lens system.

Conventional imaging system are very sensitive to defocus, as may be seen from FIG. 10, which illustrates a through focus (TF) modulation transfer function (MTF), i.e., MTF versus focus shift in millimeters for light having a wavelength of 0.5461 microns at a spatial frequency of 100 cycles per millimeter for a conventional lens system. The MTF is the spatial frequency response or modulus of the optical transfer function (OTF). The MTF of a system is a measure of the ability of the system to transfer contrast at a particular resolution level from the object to the image, i.e., MTF represents both resolution and contrast. As the spatial frequency increases at the object, it is more difficult for the lens system to efficiently transfer contrast.

Figure 11:
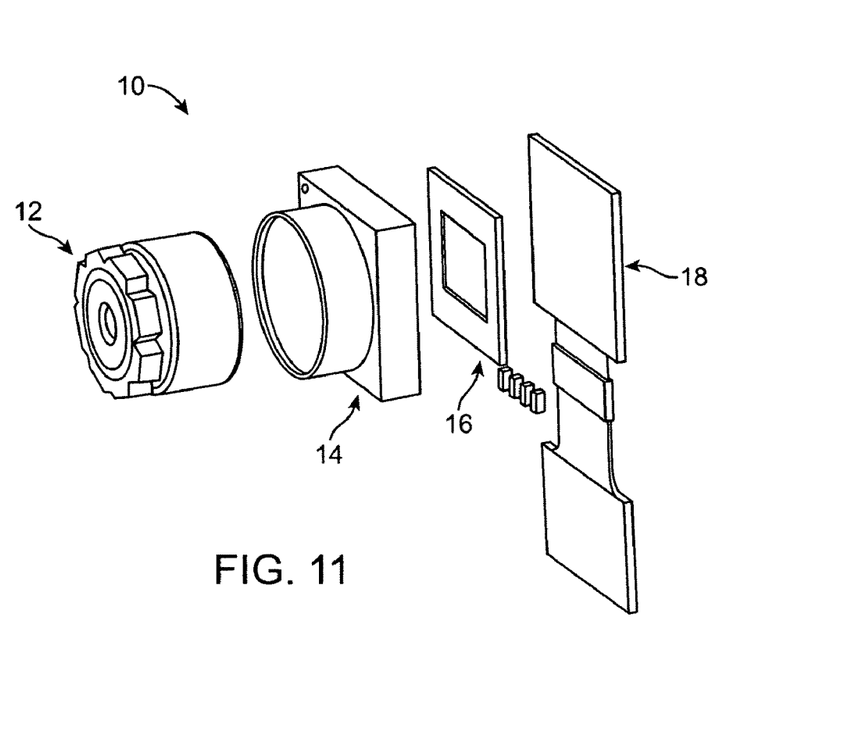
FIG. 11 illustrates an exploded view of a digital camera.

FIG. 11 illustrates an exploded view of a digital camera 10. As seen therein, the digital camera 10 may include a lens system 12 to be secured to a lens holder or barrel 14, which, in turn, may be secured to a sensor 16. Finally, the entire assembly may be secured to electronics 18.

When such a digital camera is assembled, the lens system 12 may be screwed into the lens holder 14 until an operator determines that the image is in focus. Due in part to the extreme sensitivity to defocus noted above, assembly of conventional lens systems is very delicate and requires special assembly for each lens in each camera module. The required assembly tolerance is typically a few microns, requiring active alignment. Therefore, there is a need for an imaging system with relaxed tolerances, e.g., that can be made with an assembly process that does not require manual focusing.

SUMMARY OF THE PRESENT INVENTION

Embodiments are therefore directed to an imaging system and associated methods that substantially overcome one or more of the problems due to the limitations and disadvantages of the related art.

It is a feature of an embodiment of the present invention to provide an imaging system having relaxed assembly tolerances.

It is another feature of an embodiment of the present invention to provide an imaging system having an extended depth of field (EDOF) lens secured directly to a detector.

At least one of the above and other features and advantages of the present invention may be realized by providing an imaging system, including an extended depth of field (EDOF) optical system, a sensor on a sensor substrate, and a securing mechanism adapted to secure the EDOF optical system directly to the sensor substrate.

The sensor substrate may include a package surrounding the sensor. The securing mechanism may attach the EDOF optical system to the package, the package and the EDOF optical system enclosing the sensor. The securing mechanism may include standoffs between a bottom surface of the EDOF optical system and the sensor substrate. The standoffs may be integral with the bottom surface of the EDOF optical system. The bottom surface of the EDOF optical system and the standoffs may enclose the sensor.

The EDOF optical system may be a single element. The single element may include a phase element. The phase element may be adapted to provide a more uniform modulation transfer function over a range of focus than the optical system alone, wherein an effective focal length of light output from the phase element is a function of at least one of an angular component and a radial component on which the light is incident on the phase element. The function may include a radial component and an angular component. The angular component and the radial component of the function may be separable. The angular component may be a first order equation and the radial component may be a second order equation. The angular component may approximate $\sin(\theta/2)$.

A deviation between modulation transfer functions (MTFs) within a range of at least about 5% of a height between the sensor and the EDOF optical system around a focus may be less than about 0.1.

The imaging system may further include an electrical I/O on a same surface of the sensor substrate as the sensor or on a surface of the sensor substrate opposite the sensor.

At least one of the above and other features and advantages of the present invention may be realized by providing a method of making an imaging system, including providing an extended depth of field (EDOF) optical system, and securing the EDOF optical system directly to a sensor substrate having a sensor.

Securing may include securing a plurality of EDOF optical systems to the sensor substrate having a corresponding plurality of sensors thereon, creating a plurality of imaging systems on the sensor substrate. The method may further include separating along a z-axis of the sensor substrate to form individual imaging systems from the plurality of imaging systems. The securing may seal the sensor. Securing may include attaching the EDOF optical system to a package on the sensor substrate surrounding the sensor.

BRIEF DESCRIPTION OF THE DRAWINGS

The above and other features and advantages of the present invention will become readily apparent to those of skill in the art by describing in detail embodiments thereof with reference to the attached drawings, in which.

DETAILED DESCRIPTION OF THE INVENTION

U.S. Provisional Application No. 60/825,621, filed on Sep. 14, 2006, and entitled: "DIGITAL CAMERA WITH RELAXED ASSEMBLY TOLERANCES" is hereby incorporated by reference in it entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. Like reference numerals refer to like elements throughout.

In accordance with embodiments, by using an optical system having an extended depth of field (EDOF), the MTF of the image may be both sufficiently high and have a range over which the MTF remains substantially constant, i.e., insensitive to defocus. Further, by providing an optical system directly on a detector, the separation between the optical system and the detector may be passively controlled to be within this range. First, packaging embodiments will be discussed, followed by examples of lenses.

Figures 1, 2A:
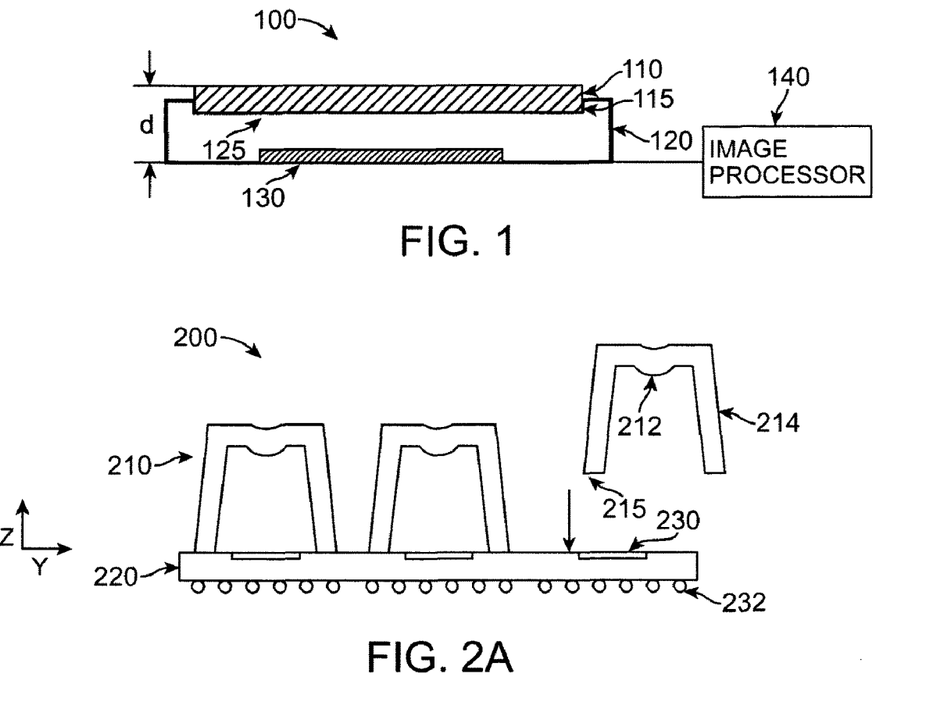
FIG. 1 illustrates a sectional schematic view of an EDOF lens assembled with a detector in accordance with an embodiment of the present invention.
FIGS. 2A and 2B illustrate a sectional schematic view of an EDOF lens assembled with a detector in accordance with an embodiment of the present invention.

As illustrated in FIG. 1, an imaging system 100 may include an optical system 110, here a single element, directly fixed using a securing mechanism 115, e.g., punched adhesive, anaerobic adhesive, thermally curable epoxies, UV curable epoxies, solder, etc., to a package 120 in which a sensor 130 is housed. For example, the optical system may be provided on a cover plate 125 of the package 120. Alternatively, the cover plate 125 may be omitted, and the optical system 110 may serve as a cover plate to protect the sensor 120. The imaging system 100 may also include an image processor 140, which may process, store, and/or display signals output from the sensor 130.

As long as a distance d between a last surface of the optical system 110 and the sensor 130 is within the focal length area, i.e., a region over which the MTF is substantially constant as opposed to a single spot of a conventional lens, sufficient performance may be realized without manual active alignment. In other words, the high tolerance to defocus of the optical system 110 may eliminate the need to actively align the optical system 110 during assembly.

While the optical system 110 is illustrated as a single element, any number of elements on substrates may be provided on the single element. For example, a plurality of optical systems may be created and secured, and then vertically separated to provide individual optical systems, as disclosed, for example, in U.S. Pat. Nos. 5,771,218 and 6,235,141, both of which are hereby incorporated by reference. This structure may still eliminate the need for a barrel discussed above and allow for simple assembly. The EDOF lens may be provided at the aperture stop of an optical system used to project an image of an object onto a sensor.

Figure 2B:
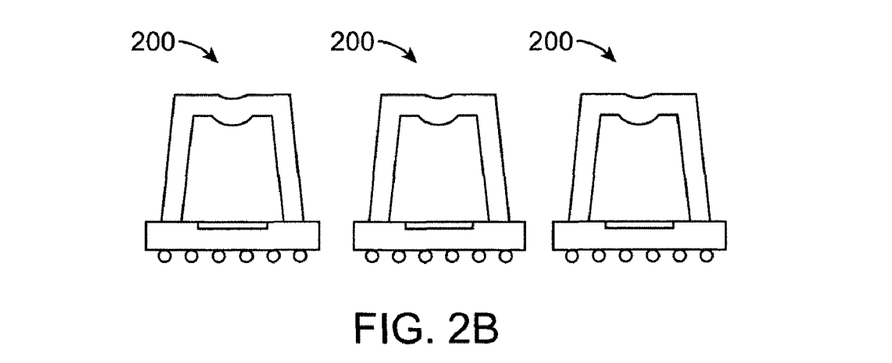

Another embodiment is illustrated in FIGS. 2A and 2B, in which an imaging system 200 may include an optical system 210, here a single element, directly fixed on a substrate 220 including sensor elements 230 therein. A bottom surface of the substrate 220 may include bottom conductive portions 232 electrically connected to the sensor elements 230 through the substrate 220 for providing electrical I/O for the sensor elements 230.

The optical system 210 may include a lens portion 212 and standoff portions 214. The standoff portions 214 may surround a corresponding sensor element 230 and may protect the sensor element 230 from environmental factors, i.e., may serve as the packaging for the sensor element 230. As long as a height of the standoffs 214 may be controlled within the focal length area, i.e., a region over which the MTF is substantially constant as opposed to a single spot of a conventional lens, sufficient performance may be realized without manual active alignment. In other words, the high tolerance to defocus of the optical system 210 may eliminate the need to actively align the optical system 210 during assembly.

As illustrated in FIG. 2A, a plurality of optical systems 210 may be secured to the sensor substrate 220 having a corresponding plurality of sensor elements 230 therein, forming a plurality of imaging systems 200. Then, as illustrated in FIG. 2B, the plurality of imaging systems 200 may be vertically separated, i.e., along the z-axis, to form individual imaging systems 200, each including the optical system 210, the sensor element 230 and bottom conductive portions 232.

Figure 2C:
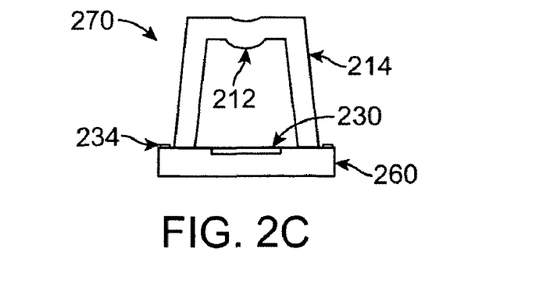
FIG. 2C illustrates a sectional schematic view of an EDOF lens assembled with a detector in accordance with an embodiment of the present invention.

Another alternative is illustrated in FIG. 2C, in which, instead of bottom conductive portions, upper contact pads 234 may be provided on an upper surface of a sensor substrate 260 having the sensor elements 230 therein, i.e., on a same surface as the sensor elements 230. The upper contact pads 234 and the sensor elements may be electrically connected along this upper surface. Again, a plurality of optical systems 210 may be secured to the substrate 260 having a corresponding plurality of sensor elements 230 therein, and then vertically separated to form individual imaging systems 270.

The electrical I/O provided by either the bottom conductive portions 232 or the upper contact pads 234 may include outputting electrical signals from the sensor element 230 to the image processor 140 of FIG. 1. The optical systems 210 may be attached to the sensor substrates 220, 260 using a securing mechanism 215, e.g., punched adhesive, anaerobic adhesive, thermally curable epoxies, UV curable epoxies, solder, etc. As illustrated in FIG. 2A, this securing mechanism may be provided on one or both surfaces of the optical system 210 and the sensor substrate 220, 260. Alternatively, when both the optical system 210 and the sensor substrate are of suitable materials, e.g., glass, they may be fused, with the securing mechanism is an anodic bond. The standoff portions 214 may be considered part of the securing mechanism.

Figure 3:
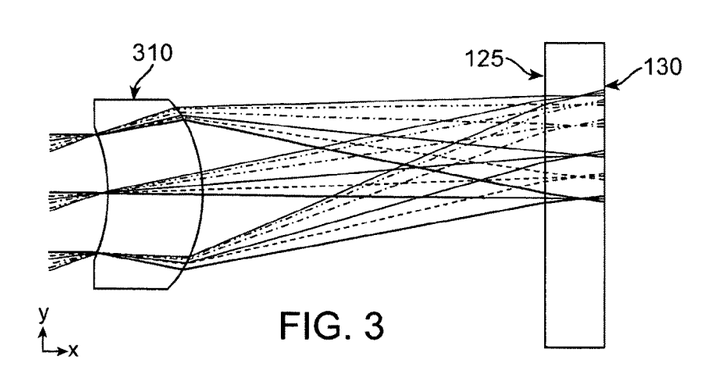
FIG. 3 illustrates an EDOF lens in accordance with an embodiment of the present invention.

An example a lens 310 that may be used as the optical system 110 or 210 is illustrated in FIG. 3, and a specific example of which is shown in Table 1:

TABLE 1

| # | Radius (mm) | Thick (mm) | Medium | Semi-Diameter | Conic | Parameter X2 | Parameter X4 | Parameter X6 | Parameter X8 | Parameter X10 |
|---|---|---|---|---|---|---|---|---|---|---|
| 0 | Infinite | Infinite | Air | 514.9 | 0.000 | 0.000 | 0.000 | 0.000 | 0.000 | 0.000 |
| 1 | −1.239 | 0.50 | Glass | 0.4 | 5.402 | 0.000 | −0.4417 | −1.471 | 0.000 | 0.000 |
| 2 | −0.808 | 1.796 | Glass | 0.5 | 0.954 | 0.000 | −.1060 | −0.2672 | 0.000 | 0.000 |
| 3 | Infinite | 0.3 | Glass | 0.8 | 0.000 | 0.000 | 0.000 | 0.000 | 0.000 | 0.000 |
| 4 | Infinite | 0.17 |  | 0.8 | 0.000 | 0.000 | 0.000 | 0.000 | 0.000 | 0.000 |

Here, surface 0 is the object, surfaces 1 and 2 are front and back surfaces, respectively, of the lens 310, surface 3 is the optional cover glass and surface 4 is the sensor.

Glass used to create the EDOF lens 310 may be any appropriate glass, such as N-LASF31 produced by Schott AG. Further, other suitable materials, e.g., plastics, e.g., polycarbonates, such as E48R produced by Zeon Chemical Company, acrylic, PMMA, etc., may be used. Additionally, each lens may be made of different materials in accordance with a desired performance thereof. The EDOF lens 310 may be made in accordance with any appropriate method for the selected material, e.g., injection molding, glass molding, replication, wafer level manufacturing, etc.

Figure 4A:
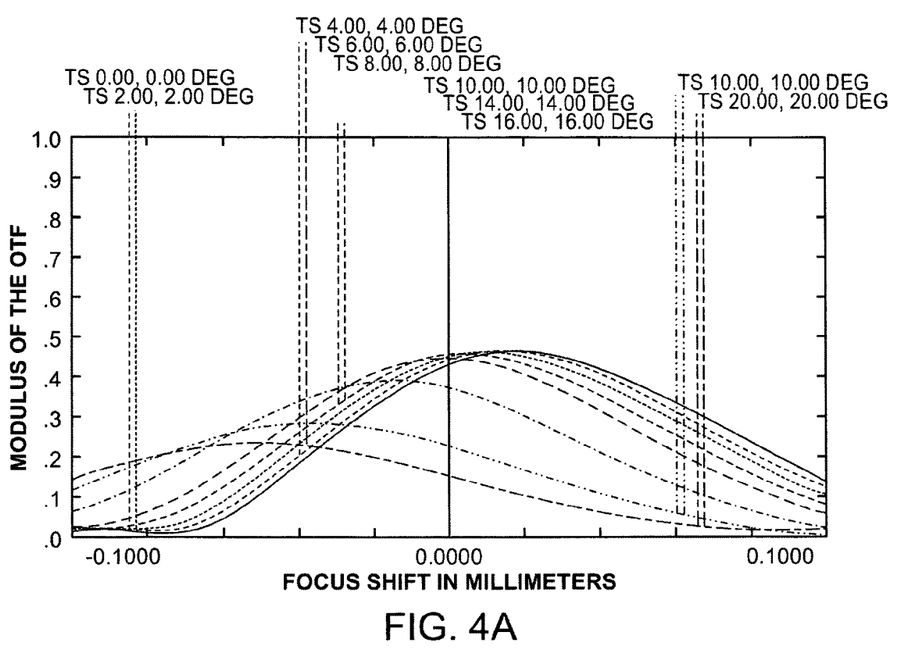
FIG. 4A illustrates a TF-MTF for the EDOF lens in FIG. 3.

FIG. 4A illustrates a TF-MTF for the EDOF lens 310 for light having a wavelength of 0.5461 microns at a spatial frequency of 100 cycles per millimeter for a conventional lens system. As can be seen therein, the EDOF lens 310 may provide, over substantial majority of field angles, an MTF peak of above about 0.3 over a range of focus of about ±40 microns, e.g., above 0.4, over a range of focus of about ±20 microns, and a deviation across the range of about 0.1 MTF.

Figure 4B:
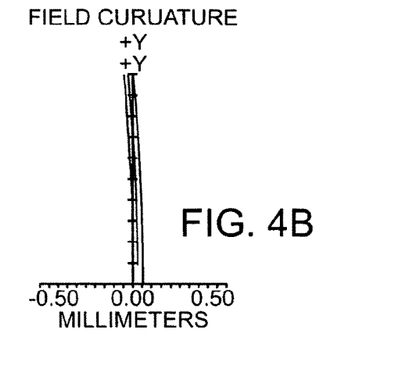
FIG. 4B illustrates field curvature for the EDOF lens in FIG. 3.
Figure 4C:
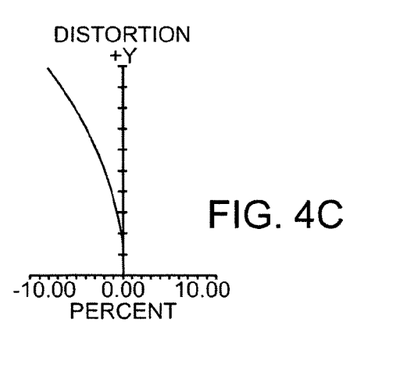
FIG. 4C illustrates distortion for the EDOF lens in FIG. 3.

FIG. 4B illustrates the field curvature of the EDOF lens 310 and FIG. 4C illustrates the distortion of the EDOF lens 310. As can be seen in FIG. 4C, the distortion of the EDOF lens 310 may be less than about 10% and may be negative monotonic distortion. Thus, the image produced by the EDOF lens 310 may be sufficient without further processing.

Figure 5:
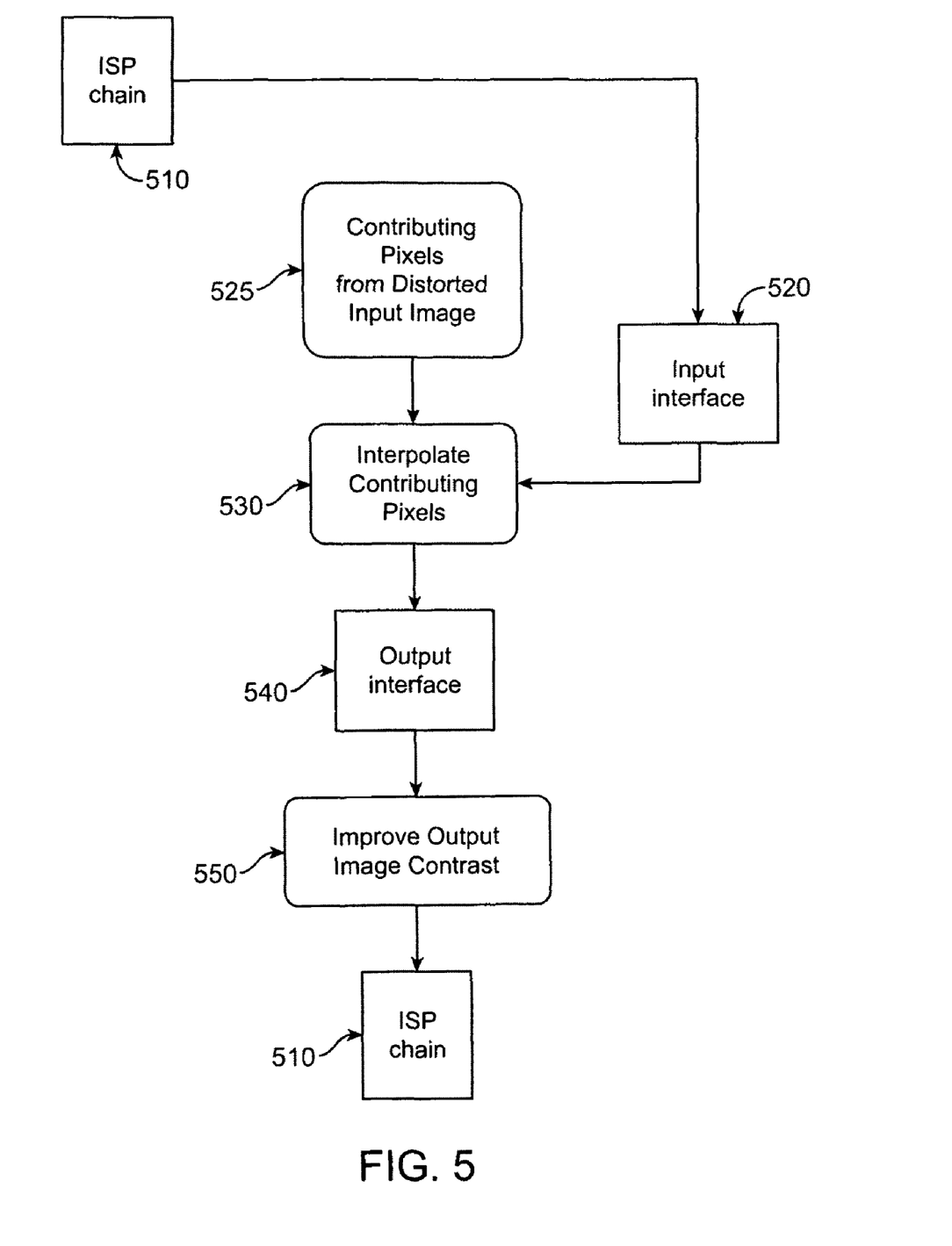
FIG. 5 illustrates a flow chart of an operation of an image processor in accordance with an embodiment.

If an improved image is desired, the processor 140 may be adapted to perform an operation illustrated in FIG. 5. The processor 140 may include an image signal processing (ISP) chain 510 that receives an image from the detector 130, 230. This image may be, for example, raw Bayer data or a bitmap image. The image may be supplied to operation 530 via an input interface 520. Operation 530 may also receive contributing pixel indices from operation 525, which determines, for every pixel index in an undistorted output image, close neighbors from the distorted input image. Then, knowing the distortion function of the lens system 410, and since the distortion is fixed, each pixel in the distorted image has a known and fixed magnification factor, thus operation 530 may correct the distortion. Correcting the distortion may be done using known transformations that calculate, according to the preconfigured desired zoom magnification, for every pixel in the desired undistorted image, which pixels from the distorted image contribute to it (as there might not be a pixel-to-pixel matching between the distorted and undistorted image, interpolation between several neighboring distorted pixels may be used to determine the value of the corresponding undistorted pixel).

Operation 530 may use any suitable interpolation method, e.g., bilinear, spline, edge-sense, bicubic spline, etc., and may output the resultant pixel values to an output interface 540. If needed in accordance with a desired end use, image contrast of the output image may be improved in operation 550. Then, the output image may be returned to the ISP chain 510, where further processing may be performed on the image, e.g., denoising or compression, such as JPEG compression or GIF compression.

Figure 6A:
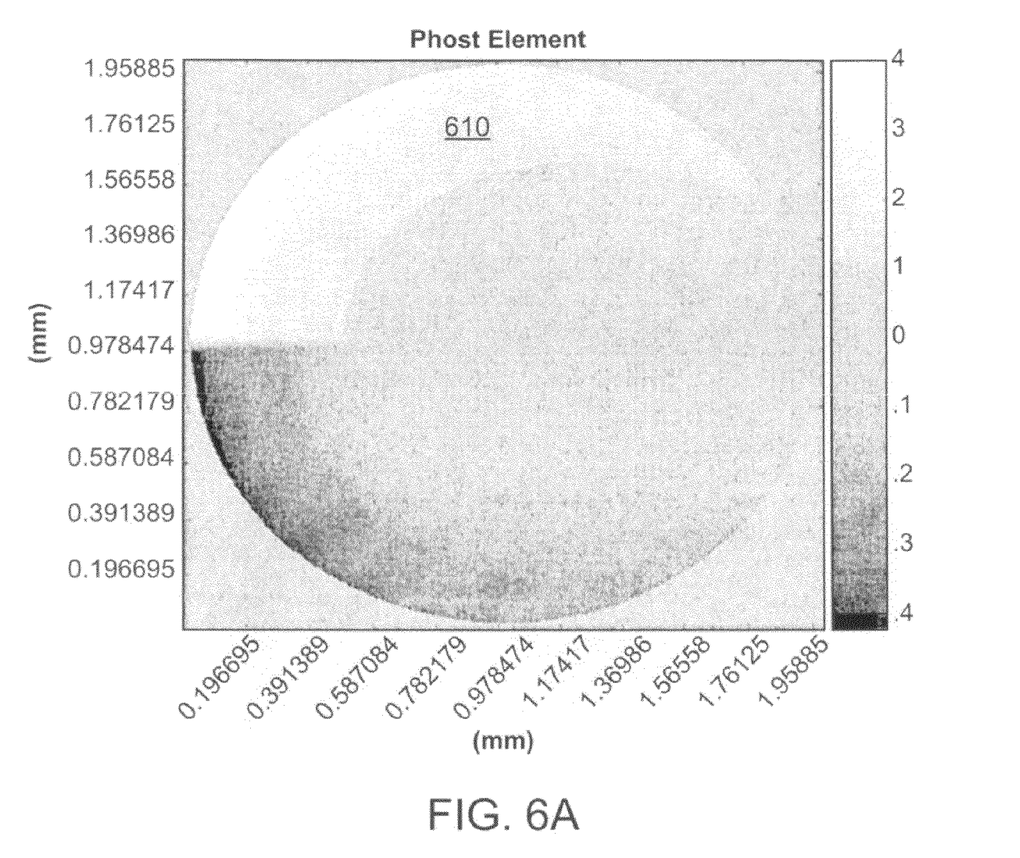
FIGS. 6A and 6B illustrate an EDOF lens in accordance with an embodiment.
Figure 6B:
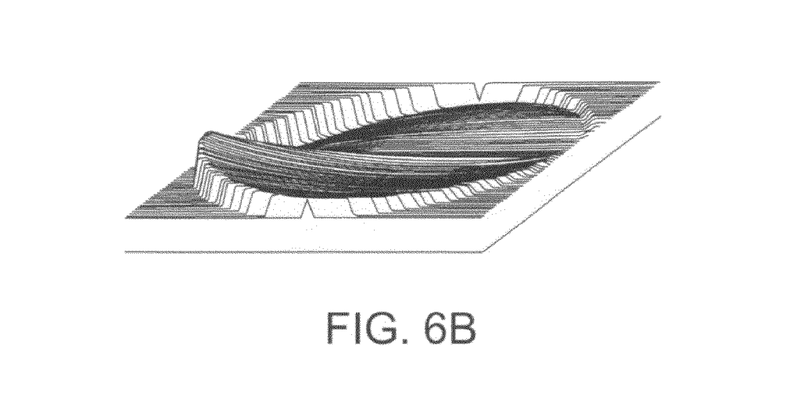

FIGS. 6A and 6B illustrate an EDOF lens 610 in accordance with an embodiment. The EDOF lens 610 may be a phase element that allocates lens area in accordance with distance only and/or angularly, e.g., primarily angularly. In this specific example, the phase and amplitude may be altered by the EDOF lens 610 as a function of the angle θ and the radial distance R as indicated by Equation 1:

$$\text{optical\_element} = \alpha(\theta,R)\exp(-iA(\theta,R)) \quad (1)$$

where $A(\theta,R)$ describes the angular and radial dependence function of the phase and $\alpha(\theta,R)$ describes the angular and radial dependence function of the attenuation. Using specific functions allows changing the focal length for each angular element, thus creating a continuous focal length for all wavelengths.

For simplification, the angular and radial components may be separated as shown in Equation 2 to:

$$\text{phase\_of\_element} = A(\theta)B(R) \quad (2)$$

when $-\pi \leq \theta \leq \pi$ and $0 \leq R \leq \text{Element\_Radius}$ where $A(\theta)$ describes the angular dependence function of the phase amplitude and $B(R)$ describes the radial dependence function. This phase may be radially asymmetric, allowing for a larger EDOF.

The particular EDOF lens 610 may have $A(\theta)$ approximating $\sin(\theta/2)$, i.e., forcing the discontinuities to be continuous, and $B(R)$ may equal $R^2$. This EDOF lens 610 may produce a different phase amplitude for each angular component and a surface thereof may have a spiral shape, as may be seen from a contour of the surface sag illustrated in FIG. 6B. In addition, using the $R^2$ function ensures that all of the light from each angular component has the same focal length change, i.e., be directed to the same spot on the Z axis.

The sag of the spiral surface may be defined as follows, to arrive at Equations 3 and 4:

$$-\pi \leq \theta < \pi \quad \Delta = \frac{\pi}{60} \quad x = \frac{\theta}{\pi}$$

$$F_1 = x - \frac{x^{11}}{11}$$

$$F_2 = \begin{cases} \left[1 - \exp\left(\frac{\theta-\pi}{\Delta}\right)\right] / \left[1 + \exp\left(\frac{\theta-\pi}{\Delta}\right)\right] & \theta \geq 0 \\ -\left[1 - \exp\left(\frac{\theta+\pi}{\Delta}\right)\right] / \left[1 + \exp\left(\frac{\theta+\pi}{\Delta}\right)\right] & \theta < 0 \end{cases}$$

-continued $$F = Amp \cdot F_1 \cdot F_2 + \text{focal} \quad (3)$$

$$Sag = R^2 \frac{(F - \text{focal})}{\text{focal} \cdot F} + Z_0 [\text{mm}] Z_0 = 0.01 \ [\text{mm}] \quad (4)$$

The image output from the sensor may be processed by the image processor 140 to remove phase changes and for spatial frequency amplification introduced by the EDOF lens 610. This process may provide an acceptable image regardless to the accuracy of the lens assembly.

Figure 7:
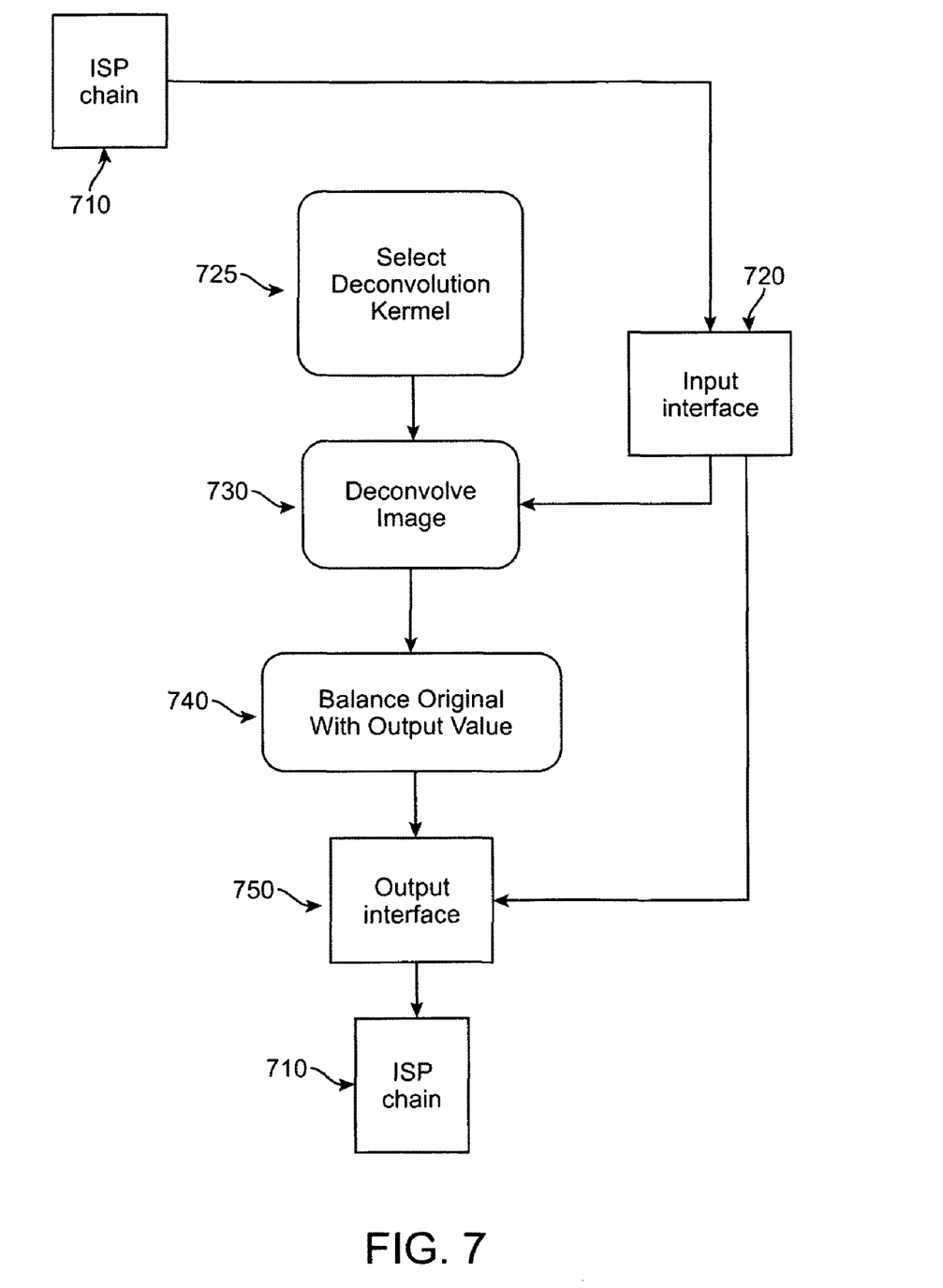
FIG. 7 illustrates a flow chart of an operation of an image processor in accordance with an embodiment.

The processor 140 may be adapted to perform an operation illustrated in FIG. 7.

As can be seen therein, the image processor 140 may include an image signal processing (ISP) chain 710 that receives an image from the detector 130, 230. This image may be, for example, raw Bayer data or a bitmap image. The image may be supplied to the operation 730 via an input interface 720. Operation 730 may also receive deconvolution kernels selected from a kernels bank in operation 725. Operation 730 may use any suitable deconvolution method, and may output the resultant pixel values to an output interface 750. If needed in accordance with a desired end use, image quality of the output image may be improved in operation 740 by balancing the original pixel value with the output pixel value. For example, the input interface 720 may supply parameters, e.g., a signal to noise estimation, information regarding the pixel environment and spatial location information, to operation 740 to accordingly adjust the output pixel value. The output image may be returned to the ISP chain 710, where further processing may be performed on the image, e.g., denoising or compression, such as JPEG compression or GIF compression.

The EDOF lens 610 may be made from any appropriate materials, e.g., plastics and glasses note above regarding the EDOF lens 310. Further, the EDOF lens 610 may be made using any appropriate process for the selected material, e.g., injection molding, glass molding, replication, etc.

Figure 8:
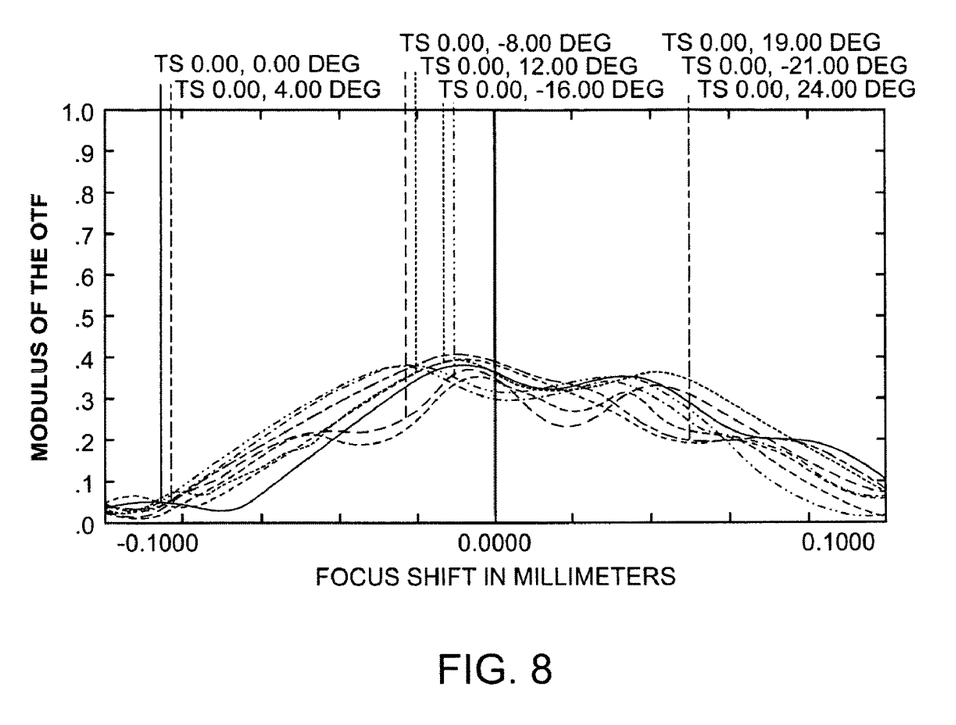
FIG. 8 illustrates a TF-MTF for the EDOF lens in FIG. 6.

FIG. 8 illustrates a TF-MTF for the EDOF lens 610 for light having a wavelength of 0.5461 microns at a spatial frequency of 100 cycles per millimeter for a conventional lens system. As can be seen therein, the EDOF lens 310 may provide an MTF peak of above about 0.3 over a range of focus of about ±40 microns and a deviation across the range of about 0.1 MTF.

Figure 9A:
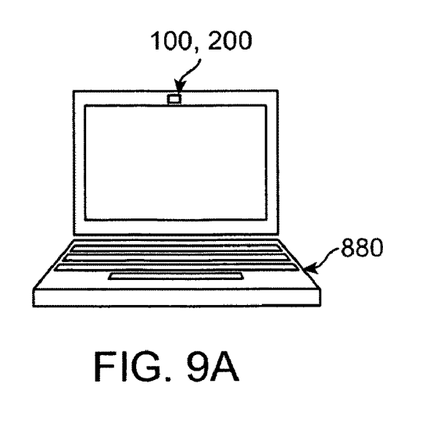
FIG. 9A illustrates a computer having a digital camera integrated therein in accordance with an embodiment.
Figure 9B:
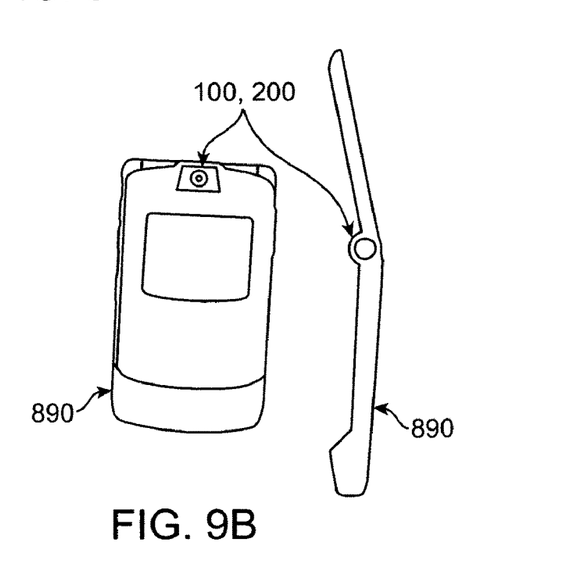
FIG. 9B illustrates a mobile telephone having a digital camera integrated therein in accordance with an embodiment.

FIG. 9A illustrates a perspective view of a computer 880 having the imaging system 100, 200 in accordance with embodiments integrated therein. FIG. 9B illustrates a front and side view of a mobile telephone 890 having the imaging system 100, 200 in accordance with embodiments. Of course, the imaging system 100, 200 may be integrated at other locations than those shown.

As can be seen by comparing FIGS. 4A, 8 and 10, using an EDOF lens in accordance with embodiments may provide an optical system that is relatively insensitive to defocus while still providing sufficient MTF. Further, by securing the EDOF lens in accordance with embodiments, e.g., providing substantially stable MTF over a range of tens of microns, directly to the sensor, either with our without packaging and/or a cover plate, passive assembly may be realized. The relaxed assembly tolerances may allow a distance between a final element of the optical system and the sensor to deviate by more than a couple of percent of the total distance.

For the examples noted above, the EDOF lenses may have a diameter of about 1 mm or less, and the EDOF lenses may be about 100-150 microns from the sensor. Therefore, the EDOF provided by using the EDOF lenses in accordance with embodiments may readily provide at least a relaxed tolerance of about 10% of the distance between the EDOF lenses and the sensor.

As described herein, when a layer or element is referred to as being "on" another layer or substrate, it can be directly on the other layer or substrate, or intervening layers may also be present. When a layer is referred to as being "under" another layer, it can be directly under, and one or more intervening layers may also be present. When a layer is referred to as being "between" two layers, it can be the only layer between the two layers, or one or more intervening layers may also be present. When an element or layer is referred to as being "connected" or "coupled" to another element or layer, it can be directly connected or coupled to the other element or layer, or intervening elements or layers may be present. In contrast, when an element is referred to as being "directly connected" or "directly coupled" to another element or layer, no intervening elements or layers are present.

As used herein, the term "and/or" includes any and all combinations of one or more of the associated listed items. Further, although terms such as "first," "second," "third," etc., may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer and/or section could be termed a second element, component, region, layer and/or section without departing from the teachings of the embodiments described herein.

Spatially relative terms, such as "beneath," "below," "lower," "above," "upper," etc., may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise. It will be further understood that the terms "comprises," "comprising," "includes," and "including" specify the presence of stated features, integers, steps, operations, elements, components, etc., but do not preclude the presence or addition thereto of one or more other features, integers, steps, operations, elements, components, groups, etc.

Embodiments of the present invention have been disclosed herein and, although specific terms are employed, they are used and are to be interpreted in a generic and descriptive sense only and not for purpose of limitation. For example, EDOF phase elements may be used having different surface sags in addition to the spiral surface discussed above. Accordingly, it will be understood by those of ordinary skill in the art that various changes in form and details may be made without departing from the spirit and scope of the present invention as set forth in the following claims.

What is claimed is:

1. An imaging system, comprising:
   an extended depth of field (EDOF) optical system, wherein the EDOF optical system is a single element including a phase element adapted to provide a more uniform modulation transfer function over a range of focus than the optical system alone, wherein an effective focal length of light output from the phase element is a function of at least one of an angular component and a radial component on which the light is incident on the phase element;
   a sensor on a sensor substrate; and
   a securing mechanism adapted to secure the EDOF optical system directly to the sensor substrate.

2. The imaging system as claimed in claim 1, wherein the sensor substrate includes a package surrounding the sensor.

3. The imaging system as claimed in claim 2, wherein securing mechanism attaches the EDOF optical system to the package, the package and the EDOF optical system enclosing the sensor.

4. The imaging system as claimed in claim 1, wherein the securing mechanism includes standoffs between a bottom surface of the EDOF optical system and the sensor substrate.

5. The imaging system as claimed in claim 4, wherein the standoffs are integral with the bottom surface of the EDOF optical system.

6. The imaging system as claimed in claim 5, wherein the bottom surface of the EDOF optical system and the standoffs enclose the sensor.

7. The imaging system as claimed in claim 4, wherein the bottom surface of the EDOF optical system and the standoffs enclose the sensor.

8. The imaging system as claimed in claim 1, wherein the function includes a radial component and an angular component.

9. The imaging system as claimed in claim 8, wherein the angular component and the radial component of the function are separable.

10. The imaging system as claimed in claim 9, wherein the angular component is a first order equation and the radial component is a second order equation.

11. The imaging system as claimed in claim 1, wherein the angular component approximates $\sin(\theta/2)$.

12. The imaging system as claimed in claim 1, wherein a deviation between modulation transfer functions (MTFs) within a range of at least 5% of a height between the sensor and the EDOF optical system, around a focus is less than about 0.1 MTF.

13. The imaging system as claimed in claim 1, further comprising an electrical I/O on a same surface of the sensor substrate as the sensor.

14. The imaging system as claimed in claim 1, further comprising an electrical I/O on a surface of the sensor substrate opposite the sensor.

15. A mobile phone including an image system according to claim 1.

16. A portable computer including an image system according to claim 1.

17. A method of making an imaging system, comprising:
   providing an extended depth of field (EDOF) optical system, wherein the EDOF optical system is a single element including a phase element adapted to provide a more uniform modulation transfer function over a range of focus than the optical system alone, wherein an effective focal length of light output from the phase element is a function of at least one of an angular component and a radial component on which the light is incident on the phase element; and
   securing the EDOF optical system directly to a sensor substrate having a sensor.

18. The method as claimed in claim 17, wherein securing includes securing a plurality of EDOF optical systems to the sensor substrate having a corresponding plurality of sensors thereon, creating a plurality of imaging systems on the sensor substrate.

19. The method as claimed in claim 18, further comprising separating along the z-axis of the sensor substrate to form individual imaging systems from the plurality of imaging systems.

20. The method as claimed in claim 17, wherein securing seals the sensor.

21. The method as claimed in claim 17, wherein securing includes attaching the EDOF optical system to a package on the sensor substrate surrounding the sensor.

22. An imaging system, comprising:
   an extended depth of field (EDOF) optical system;
   a sensor on a sensor substrate, wherein a deviation between modulation transfer functions (MTFs) within a range of at least 5% of a height between the sensor and the EDOF optical system, around a focus is less than about 0.1 MTF; and
   a securing mechanism adapted to secure the EDOF optical system directly to the sensor substrate.

* * * * *